United States Patent [19]
Dirmeyer et al.

[11] Patent Number: 5,831,835
[45] Date of Patent: Nov. 3, 1998

[54] PRESS GRID FOR ELECTRICALLY CONNECTING CIRCUIT COMPONENTS

[75] Inventors: Josef Dirmeyer, Bodenwöhr; Christian Plankl, Burgweinting; Marten Swart, Obertraubling; Alfred Gottlieb, Nittendorf//Undorf, all of Germany

[73] Assignee: Siemens Aktiengesellschaft, Munich, Germany

[21] Appl. No.: 808,785

[22] Filed: Feb. 28, 1997

Related U.S. Application Data

[63] Continuation of PCT/DE95/01148, Aug. 28, 1995 published as WO96/07302, Mar. 7, 1996.

[30] Foreign Application Priority Data

Aug. 9, 1904 [DE] Germany .......................... 44 30 798.5

[51] Int. Cl.⁶ .................................................. H05K 9/00
[52] U.S. Cl. ......................... 361/818; 361/813; 361/807; 361/809
[58] Field of Search ................................. 174/52.2, 52.4, 174/252, 35 R, 35 GC, 35 C, 51; 257/666, 668, 676, 678, 728, 659, 660; 361/704, 707, 715–722, 728, 730, 736, 748, 807, 809, 813, 816, 818; 439/68, 70, 74, 497, 607; 330/68; 331/67; 334/85; 343/841; 455/347, 300, 301

[56] References Cited

U.S. PATENT DOCUMENTS

| | | | |
|---|---|---|---|
| 3,158,926 | 12/1964 | Nieter | 174/267 |
| 3,216,089 | 11/1965 | Dettman | 361/813 |
| 3,697,816 | 10/1972 | Dull | . |
| 3,810,300 | 5/1974 | Hulmes | . |
| 3,978,375 | 8/1976 | Fukui et al. | . |
| 4,649,461 | 3/1987 | Matsuta | 361/818 |
| 4,766,520 | 8/1988 | Huber et al. | 361/736 |
| 5,162,971 | 11/1992 | Sato et al. | 361/818 |
| 5,521,785 | 5/1996 | Schmidt et al. | 361/813 |
| 5,557,508 | 9/1996 | Sato et al. | 361/818 |

FOREIGN PATENT DOCUMENTS

| | | |
|---|---|---|
| 0 241 675 B1 | 10/1987 | European Pat. Off. . |
| 0 312 415 B1 | 4/1989 | European Pat. Off. . |
| 0 387 845 A1 | 9/1990 | European Pat. Off. . |
| 2 356 247 | 1/1978 | France . |
| 2 361 007 | 3/1978 | France . |
| 80 34 130.6 U1 | 5/1981 | Germany . |
| 31 42 263 A1 | 5/1983 | Germany . |
| 36 11 224 A1 | 10/1987 | Germany . |
| 93 00 869.4 U1 | 5/1994 | Germany . |
| 4-162790 | 6/1982 | Japan ............ 361/748 |

*Primary Examiner*—Donald Sparks
*Attorney, Agent, or Firm*—Herbert L. Lerner; Lawrence A. Greenberg

[57] ABSTRACT

A device with an electric circuit configuration includes electrical components and a pressed grid stamped from a metal strip for electrically conductively connecting the electrical components to one another. The pressed grid has bent-over large-area peripheral regions and a plug part with connection pins stamped out of the metal strip.

3 Claims, 1 Drawing Sheet

PRESS GRID FOR ELECTRICALLY CONNECTING CIRCUIT COMPONENTS

CROSS-REFERENCE TO RELATED APPLICATION

This application is a Continuation of International Application Serial No. PCT/DE95/01148, filed Aug. 28, 1995 published as WO96/07302, Mar. 7, 1996.

BACKGROUND OF THE INVENTION

Field of the Invention

The invention relates to a device with an electrical circuit configuration, having a pressed grid stamped from a metal strip for electrically conductively connecting electrical components to one another, and a plug part with connection pins constructed as parts of the pressed grid stamped out of the metal strip.

The use of pressed grids or screens as a replacement for conventional printed circuit boards is advantageous because of reduced production costs, if only a few electrical components are electrically conductively connected to one another, especially if the components themselves are already LSI circuits.

In a device with an electric circuit configuration which is known from U.S. Pat. No. 3,697,816, a pressed grid stamped out of a metal strip electrically conductively connects electrical components to one another. That pressed grid can be cast or secured together with an electrical plug connection, such as with electrical connection pins, for instance, in a housing. Producing such a device with a pressed grid for connecting electrical components and with a plug part having connection pins requires many production steps, especially for making the plug part and for connecting the connection pins of the plug part to the pressed grid.

German Published, Non-Prosecuted Patent Application DE 36 11 224 A1 describes a pressed grid in which at least some portions are connected to one another through plastic bridges, so that conductor tracks of the pressed grid are fixed in their mutual spatial relationship, and conductor tracks of different potential are insulated from one another. However, that pressed grid does not connect electrical components to one another. It is constructed as an inlay part for a housing that connects a plug part with electrical connection pins to a conventional printed circuit board. To that end, the inlay part has contact surfaces which act as bond pads for a bonded connection between the inlay part and the printed circuit board. The connection pins of the plug part are in the form of pins which are constructed separately from the pressed grid and are disposed on the pressed grid through rivet connections.

SUMMARY OF THE INVENTION

It is accordingly an object of the invention to provide a device with an electric circuit configuration, which has a plug connection and which overcomes the hereinafore-mentioned disadvantages of the heretofore-known devices of this general type.

With the foregoing and other objects in view there is provided, in accordance with the invention, a device with an electric circuit configuration, comprising electrical components; and a pressed grid stamped from a metal strip for electrically conductively connecting the electrical components to one another, the pressed grid having bent-over large-area peripheral regions, and the pressed grid having a plug part with connection pins stamped out of the metal strip.

In accordance with another feature of the invention, the plug part has a plug housing, and the plug housing has at least one external socket made from plastic.

In accordance with a further feature of the invention, the pressed grid is thicker in the vicinity of the connection pins than in the vicinity of the electrical components.

In accordance with an added feature of the invention, there are provided plastic supports disposed on the pressed grid for the electrical components.

In accordance with a concomitant feature of the invention, at least regions of the pressed grid are joined to one another by plastic bridges.

Other features which are considered as characteristic for the invention are set forth in the appended claims.

Although the invention is illustrated and described herein as embodied in a device with an electric circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
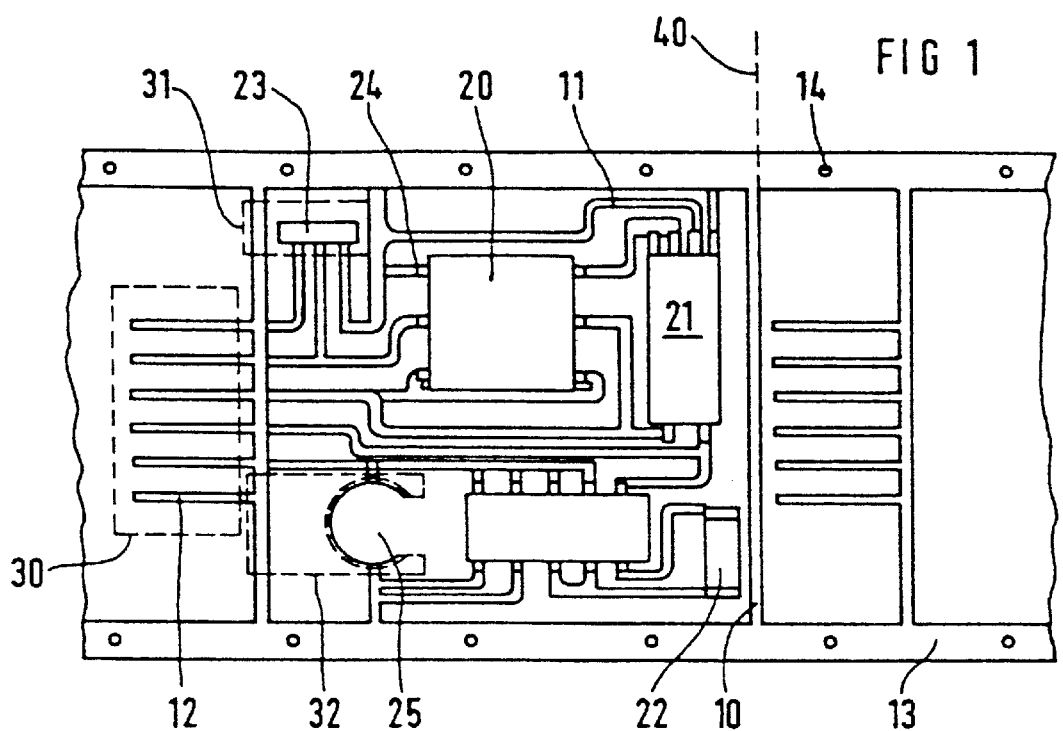
FIG. 1 is a fragmentary, diagrammatic, plan view of a pressed grid with electrical components that is mounted in a continuous strip.

Referring now to the figures of the drawings in detail and first, particularly, to FIG. 1 thereof, there is seen a pressed grid 10 with metal strips 11, which act as conductor tracks for connecting electrical components 20, 21, 22, 23, 25 that are mounted on the pressed grid 10, for instance by being glued thereto. The components 20, 21, 22, 23, 25 are constructed, for instance, as an integrated circuit 20, a sensor 21, a resistor 22, a capacitor 25 and an acceleration sensor 23. The components are welded or soldered to the pressed grid 10 through terminal leads 24 thereof. The terminal leads may be extended through suitable openings in the pressed grid 10 and then soldered. Alternatively, the terminal leads may be bent over in such a way that they can be soldered to the surface of the pressed grid 10. It is also possible to mount so-called "naked" chips. For instance, in such a case the chip body is secured to the pressed grid 10 by gluing, and the individual terminals are produced between the chip and the pressed grid 10 through bonding wires.

Portions of the pressed grid 10 are constructed as connection pins 12, which are part of a plug part with which the device can be connected to cables or other circuits.

The pressed grid 10 is spray-coated with plastic for protection, once all of the components have been mounted on the pressed grid 10 and electrically conductively connected thereto. Thus the pressed grid 10 is surrounded by a plastic housing that is permanently connected thereto.

Jointly injected into this housing are, for instance, an external socket 30 for the plug parts, which surrounds the connection pins 12, or supports 31, 32 for components, such as a support 31 for the acceleration sensor 23 or a support 32 for the capacitor 25.

In order to provide mutual fixation of conductor tracks of the pressed grid 10, the regions 11 of the pressed grid 10 that act as conductor tracks are expediently also plastic-coated, which additionally assures good insulation between the conductor tracks, even under unfavorable circumstances such as wetness, and additionally gives the pressed grid mechanical strength.

In order to provide so-called in-line production, or in other words production on a moving belt, a long pressed grid strip is used that has a number of identical pressed grid structures which are connected to one another for a circuit configuration. The pressed grid strip has openings 14 located in a peripheral region 13, with which the strip can be transported onward. These openings 14 can be disposed in such a way that upon later installation of the device, for instance in the engine compartment of a motor vehicle, they act to mechanically secure the control circuit to support structures. The peripheral regions 13 protrude beyond any possible plastic sheathing. After component mounting, the individual pressed grids 10 are cut apart along a line indicated at reference numeral 40.

If the pressed grid has large peripheral regions 13, which extend beyond the actual region of the connecting structures, then electromagnetic shielding can also be attained by bending over these peripheral regions 13. These peripheral regions 13 may also act as cooling surfaces.

Figure 2:
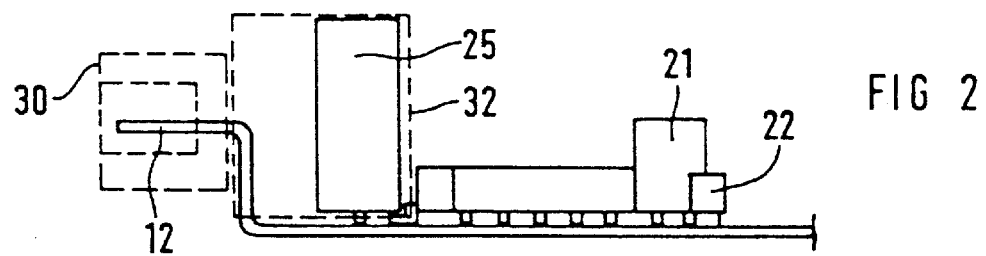
FIG. 2 is a side-elevational view of the configuration of FIG. 1.

It becomes clear particularly from FIG. 2 that parts of the pressed grid, such as the connection pins 12, can also be bent in arbitrary directions, so as to place the plug part at a defined level relative to the remainder of the circuit configuration.

Figure 3:
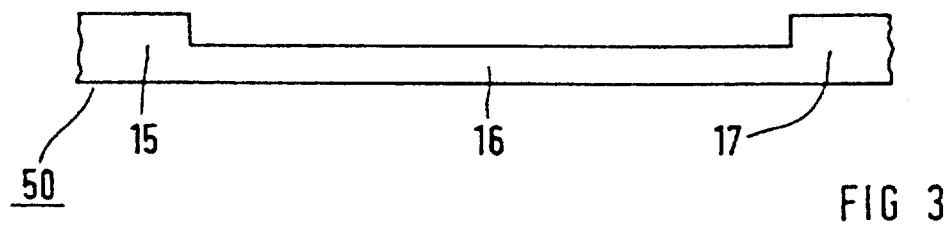
FIG. 3 is a fragmentary, side-elevational view of a pressed grid with portions of varying thickness.

FIG. 3 shows a side-elevational view of a second embodiment of the pressed grid 10 with variously thick portions. A thicker portion 17 has a higher mechanical stability and can be used, for instance, to mechanically secure the pressed grid 10. The connection pins 12 of the plug part can be stamped out of a thicker portion 15, if the standardization of the plug part demands thicker connection pins. In the case of the conductor tracks themselves, a lesser thickness suffices, as is indicated herein in a middle portion 16.

A contacting region of the connection pins 12, or in other words a portion of the metal strip from which the connection pins 12 are stamped can, for instance, be coated with gold 50, in order to assure noncorroding contacts.

The result that is obtained is thus a device with a circuit configuration on a pressed grid, which as compared with devices having conventional printed circuit boards has the following advantages: The pressed grid of metal is more readily recycled than a typical printed circuit board, which is composed of different plastic and metal layers. The electrical plug connection of the device is more reliable, since in the region of the plug part there is no need for soldering points to connect separate connection pins to the pressed grid, because of the integral construction of the connection pins with the pressed grid. The pressed grid with the electrical components can be spray-coated directly with a protective plastic, so that the stamped conductor tracks, even under unfavorable operating conditions such as wetness, assure more-reliable insulation than what is offered by conductor tracks located in the open on a printed circuit board. The sheathing plastic may simultaneously form the housing, even one with integrated cast-on plug sockets, thus saving steps in the mounting process that would otherwise be necessary in order to mount separate housing parts and plugs. Due to the spray coating with plastic, the conductor tracks are also given a mechanical hold. Once the pressed grid has been given the necessary mechanical strength by being at least partly spray-coated with plastic, gaps are stamped into the pressed grid. Conductor track regions are insulated from one another through the use of this connection of regions of the pressed grid through plastic bridges. The pressed grid moreover then has high mechanical stability.

We claim:

1. A device with an electric circuit configuration, comprising:

electrical components; and a pressed grid stamped from a metal strip for electrically conductively connecting said electrical components to one another, said pressed grid having bent-over large-area peripheral regions for providing electromagnetic shielding of said electric components, and said pressed grid having a plug part with connection pins stamped out of said metal strip.

2. The device according to claim 1, wherein said plug part has a plug housing, and said plug housing has at least one external socket made from plastic.

3. The device according to claim 1, wherein said pressed grid is thicker in the vicinity of said connection pins than in the vicinity of said electrical components.

\* \* \* \* \*

UNITED STATES PATENT AND TRADEMARK OFFICE
CERTIFICATE OF CORRECTION

PATENT NO : 5,831,835
DATED : November 3, 1998
INVENTOR(S): Josef Dirmeyer et al.

It is certified that error appears in the above-identified patent and that said Letters Patent is hereby corrected as shown below:

On the title page,
Item [30] should read as follows:

Aug. 30, 1994   [DE]        Germany ............ 44 30 798.5

Signed and Sealed this

Twenty-fifth Day of May, 1999

Attest:

Q. TODD DICKINSON

*Attesting Officer*           *Acting Commissioner of Patents and Trademarks*